(12) United States Patent
Fujimura et al.

(10) Patent No.: US 6,486,046 B2
(45) Date of Patent: Nov. 26, 2002

(54) METHOD OF FORMING POLYCRYSTALLINE SEMICONDUCTOR FILM

(75) Inventors: Takashi Fujimura, Fukaya (JP); Shinichi Kawamura, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/954,152

(22) Filed: Sep. 18, 2001

(65) Prior Publication Data

US 2002/0034845 A1 Mar. 21, 2002

(30) Foreign Application Priority Data

Sep. 18, 2000 (JP) ........................................ 2000-281353
Jul. 9, 2001 (JP) ........................................ 2001-208028

(51) Int. Cl.[7] .......................... H01L 21/20; H01L 21/36
(52) U.S. Cl. ...................... 438/491; 438/150; 438/162; 438/166; 438/486; 438/487; 438/488; 438/795; 438/797; 438/798; 438/799
(58) Field of Search ................................ 438/150, 162, 438/166, 486–488, 491, 795, 797, 798, 799

(56) References Cited

U.S. PATENT DOCUMENTS 5,346,850 A * 9/1994 Kaschmitter et al. ......... 437/81
5,456,763 A * 10/1995 Kaschmitter et al. ....... 136/258

FOREIGN PATENT DOCUMENTS

JP 2001060551 A 3/2001

OTHER PUBLICATIONS

Suga et al., "P–3: The Effect of a Laser Annealing Ambient on the Morphology and TFT Performance of Poly–Si Films," SID 00 Digest, 2000 SID, pp. 534–537.

* cited by examiner

Primary Examiner—Kamand Cuneo
Assistant Examiner—David A. Zarneke
(74) Attorney, Agent, or Firm—Pillsbury Winthrop LLP

(57) ABSTRACT

It is possible to prevent lowering in productivity of thin-film transistors with no decrease in performance of the transistors. Provided are depositing an amorphous semiconductor film on a substrate, a first irradiating the amorphous semiconductor film with an energy-rich beam in an atmosphere of a gas containing an inert gas as a major component with a specific amount of oxygen, to change the amorphous semiconductor film into a polycrystalline semiconductor film, and a second irradiating the polycrystalline semiconductor film with an energy-rich beam in an atmosphere of a gas containing an inert gas as major component with oxygen of an amount less than the specific amount.

14 Claims, 10 Drawing Sheets

METHOD OF FORMING POLYCRYSTALLINE SEMICONDUCTOR FILM

CROSS REFERENCE TO RELATED APPLICATIONS

This application claims benefit of priority under 35USC §119 to Japanese Patent Application Nos. 2000-281353 and 2001-208028 filed on Sep. 18, 2000 and Jul. 9, 2001, respectively, in Japan, the entire contents of which are incorporated by reference herein.

BACKGROUND OF THE INVENTION

The present invention relates to a method of forming a polycrystalline semiconductor film. Particularly, this invention relates to a method of forming a polycrystalline semiconductor film as an active layer for thin-film transistors used for liquid crystal displays, etc.

With advanced miniaturization in liquid crystal displays, thin-film transistors (TFT) having polycrystalline silicon with high mobility used for active layers have recently been used instead of known transistors having amorphous silicon as active layers.

Described with reference to FIG. 6 is a known method of producing a transistor having polycrystalline silicon used for an active layer.

As shown in FIG. 6(a), a thin film 42 of amorphous semiconductor is deposited on an insulating film 41 made of glass for example. The thin film 42 is irradiated with energy-rich beams such as the excimer laser to be melted for recrystallization, and hence changed into a polycrystalline thin film 43 as shown in FIG. 6(b). The thin film 43 is patterned, followed by impurity doping to form semiconductor films 43a of low concentration as shown in FIG. 6(c).

Next, as shown in FIG. 6(d), the semiconductor films 43a are covered with a gate insulating film 44. A metallic film is formed on the film 44 and pattered, thus forming a gate electrode 45 for an n-channel transistor and a metallic film 45a that covers the semiconductor film 43a for a p-channel transistor. Subsequently, p- or n-type dopant is implanted into the semiconductor films 43a at a high concentration via the gate electrode 45 as a mask, to form an n-type source/drain region 46 as shown in FIG. 6(d).

A resist pattern 50 made of photoresist is formed as shown in FIG. 6(e). The metallic film 45a is patterned with this resist pattern to form a gate electrode 45a for the p-channel transistor. P-type dopant of high concentration is implanted into the semiconductor film 43a for the p-channel transistor while masked with the resist pattern 50 and the gate electrodes 45a to form p-type source/drain regions 47.

The resist pattern 50 is removed, followed by annealing for dopant activation, and an interlayer insulating film 48 is formed on the entire surface as shown in FIG. 6(f). Contact holes are formed on insulating films 48 and 44 and are filled with an electrode-material film. The film is patterned to form source/drain electrodes 49, thus producing the transistor.

Not only by irradiation of energy-rich beams such as the excimer laser, polycrystalline silicon films can be formed by, for example, solid phase epitaxy with annealing amorphous silicon for a long time at a temperature in the range from about 400° C. to 600° C. In general, however, polycrystalline silicon films formed by solid phase epitaxy have lower carrier mobility than those formed by irradiation of energy-rich beams for recrystallization by melting. Moreover, large substrates can easily be recrystallized by irradiation of energy-rich line beams, but not by solid phase epitaxy. Polycrystalline silicon films formed by solid phase epitaxy thus cannot be used for high-speed circuitry, and hence used only for small liquid crystal displays.

Irradiation of energy-rich beams such as the excimer laser for recrystallization of amorphous silicon by melting causes roughness on the silicon surface. Shown in FIG. 5 is a cross-sectional view of a thin-film transistor having an active layer of polycrystalline silicon formed by irradiation of the excimer laser. It is expected from FIG. 5 that a gate insulating film 44, which is formed on a polycrystalline silicon 43a having roughness formed on an insulative substrate 41, has thin sections formed on convex portions of the polycrystalline silicon.

Gate insulating films having thin portions cause a decrease in gate dielectric strength. FIG. 4 indicates leak current dependency on voltage for oxide films. One oxide film was formed on a substrate of single crystalline silicon whereas the other film having the same thickness as the former was formed a polycrystalline silicon film which was formed by irradiating the excimer laser. The graphs teach that a leak current flowed through the oxide film formed on the polycrystalline silicon film at an extremely low voltage compared to the single crystal silicon. It is speculated that electric fields converged on the surface convex sections might have caused generation of current on the convex sections.

Thin-film transistors having polycrystalline silicon as active layers thus require a thick gate insulating film. An on state current for thin-film transistors are inverse proportional to the thickness of a gate insulating film. A thick gate insulating film mitigates roughness on the surface of a polycrystalline silicon film, however, it causes decrease in performance of transistors.

It is speculated that such roughness that causes decrease in performance of thin-film transistors is formed on the surface of a polycrystalline silicon due to segregation of an oxide film formed on the surface of amorphous silicon or formed with oxygen existing in the atmosphere irradiated with laser, during recrystallization by melting.

Such roughness thus can be mitigated by complete removal of an oxide film formed on the surface of amorphous silicon with lowering a partial pressure of oxygen existing in the atmosphere irradiated with laser. Laser annealing under this condition, however, causes abrasion of a silicon film at energy lower than that of laser beam irradiation required for grain of polycrystalline silicon to become large enough. Or, it causes increase in energy of laser beams for crystallization. This results in decreasing in operating rate of an apparatus for irradiating the laser beams.

Such a problem is solved by atomospheric laser annealing for enlarging grain of polycrystalline silicon, followed by removal of the surface oxide film with hydrogen fluoride (HF) and vacuum laser annealing for minimizing roughness on the surface of polycrystalline silicon. This is proposed in K. Suga et al., "The Effect of a Laser Annealing Ambient on the Morphology and TFT Performance of Poly-Si Films", Society for Information Display 00 DIGEST, p534–537, May 2000.

This method, however, requires decompression from ambient pressure to vacuum for laser annealing or two separate systems for ambient pressure only and vacuum only. Either way requires HF treatment after atomospheric laser annealing, thus decreasing productivity.

SUMMARY OF THE INVENTION

A purpose of the present invention is to provide a method of forming a polycrystalline semiconductor film that provides high performance for thin-film transistors having this polycrystalline semiconductor film and high productivity.

A first aspect of a method of forming a polycrystalline semiconductor film according to the present invention includes depositing an amorphous semiconductor film on a substrate, a first irradiating the amorphous semiconductor film with an energy-rich beam in an atmosphere of a gas containing an inert gas as a major component with a specific amount of oxygen, to change the amorphous semiconductor film into a polycrystalline semiconductor film, and a second irradiating the polycrystalline semiconductor film with an energy-rich beam in an atmosphere of a gas containing an inert gas as a major component with oxygen of an amount less than the specific amount.

The amount of oxygen for the first irradiating may be 5 ppm or more but less than 10% and the amount of oxygen for the second irradiating is preferably 200 ppm.

The total amount of energy for the second irradiating may be larger than the total amount of energy for the first irradiating.

It may be that the polycrystalline semiconductor film is exposed to an atmosphere between the first irradiating and the second irradiating, the atmosphere having an oxygen concentration higher than oxygen concentrations in the atmospheres in the first and the second irradiating.

The first and the second irradiating may be performed in the same processing chamber.

It may be to perform removing a natural oxide film formed on the surface of the amorphous semiconductor film before the first irradiating.

It may be to perform crystallization while splaying an area of the substrate, that is irradiated with the energy-rich beam, with a gas at a pressure higher than an ambient pressure in a processing chamber.

It may be to use an excimer laser beam as the energy-rich beam.

The number of irradiation of the energy-rich beam in the first irradiating may be smaller than the number of irradiation of the energy-rich beam in the second irradiating.

Moreover, a second aspect of a method of forming a polycrystalline semiconductor film according to the present invention includes forming a polycrystalline semiconductor film on a substrate, irradiating the polycrystalline semiconductor film with an energy-rich beam in an atmosphere of a gas containing an inert gas as a major component with oxygen, an amount of the oxygen being 1 ppm or more but 50 ppm or less.

Furthermore, a third aspect of a method of forming a polycrystalline semiconductor film according to the present invention includes depositing an amorphous semiconductor film on a substrate, removing a natural oxide film on the amorphous semiconductor film, first irradiating the amorphous semiconductor film with an energy-rich beam in an atmosphere of a gas containing an inert gas as a major component with oxygen, an amount of the oxygen being 5 ppm or more but less than 10%, to change the amorphous semiconductor film into a polycrystalline semiconductor film, and second irradiating the polycrystalline semiconductor film with an energy-rich beam in an atmosphere containing an inert gas as a major component with oxygen, an amount of the oxygen being 1 ppm or more but 50 ppm or less.

It may be to perform crystallization while splaying an area of the substrate, that is irradiated with the energy-rich beam, with a gas at a pressure higher than an ambient pressure in a processing chamber.

DETAIL DESCRIPTION OF EMBODIMENTS

Embodiments of forming a polycrystalline semiconductor film according to the present invention will be disclosed with reference to the attached drawings.

First Embodiment

Figure 1:
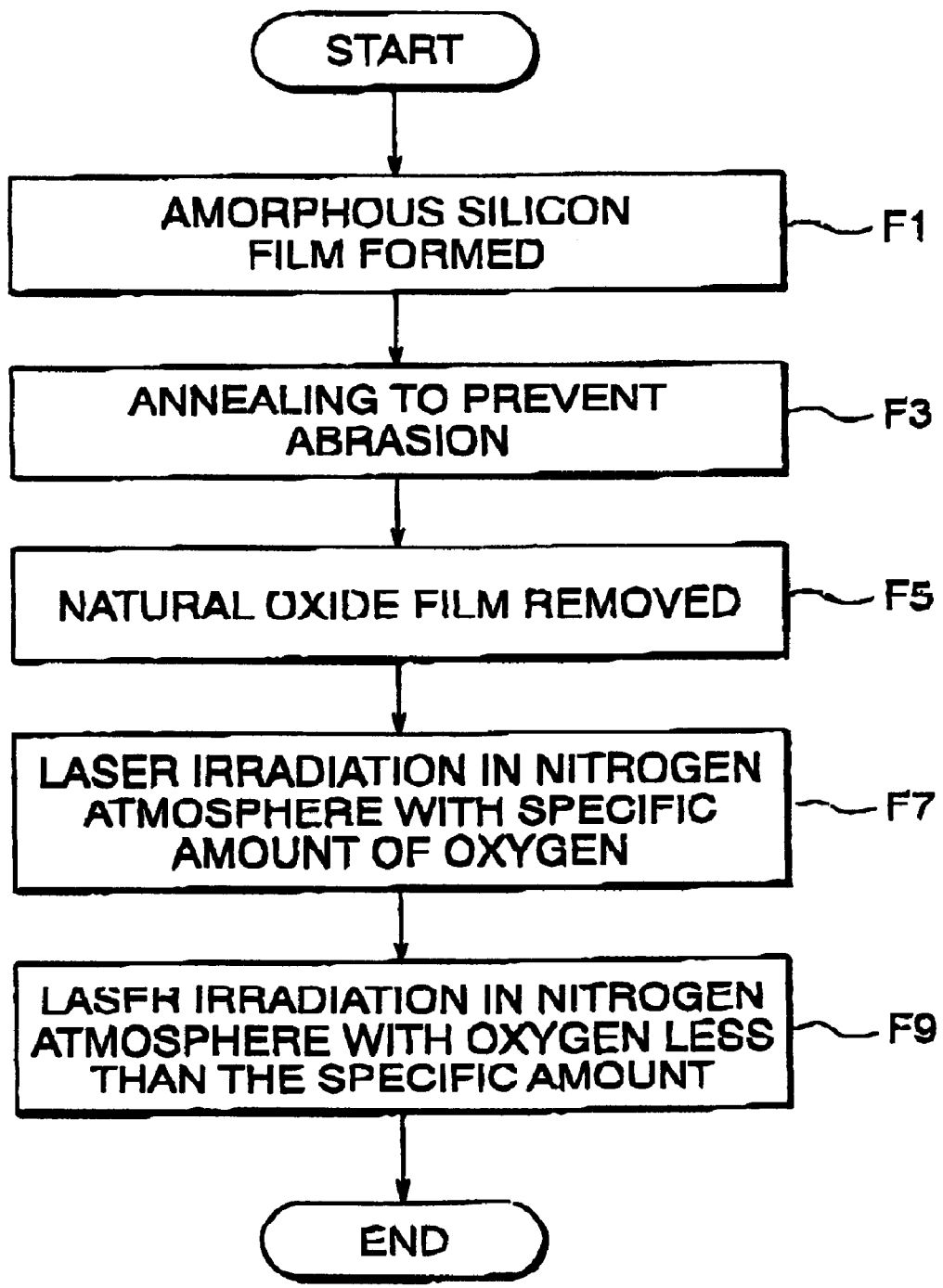
FIG. 1 is a flow chart of a first embodiment of a method of forming a polycrystalline semiconductor film according to the present invention.
Figure 2:
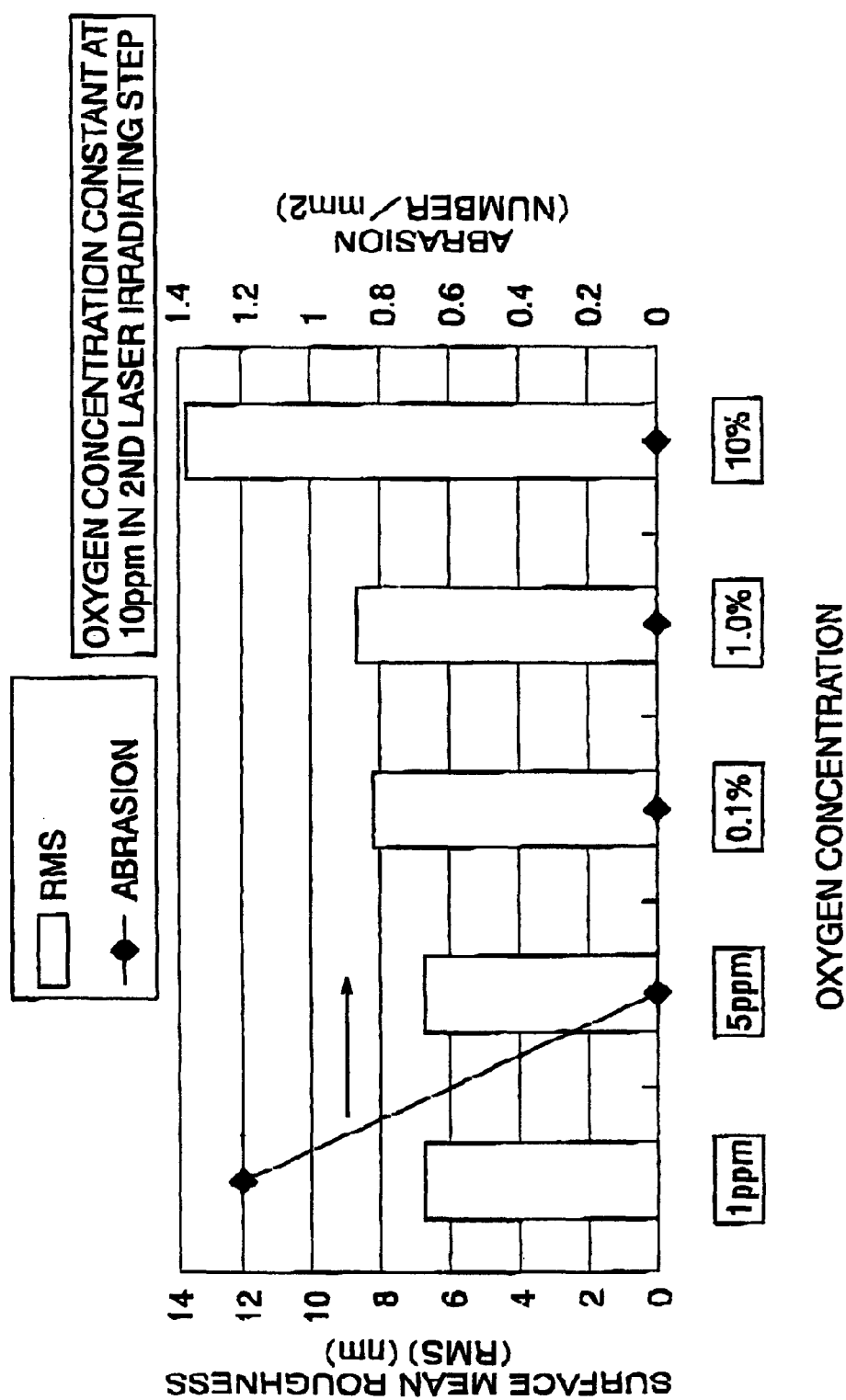
FIG. 2 explains effects of the first embodiment.
Figure 3:
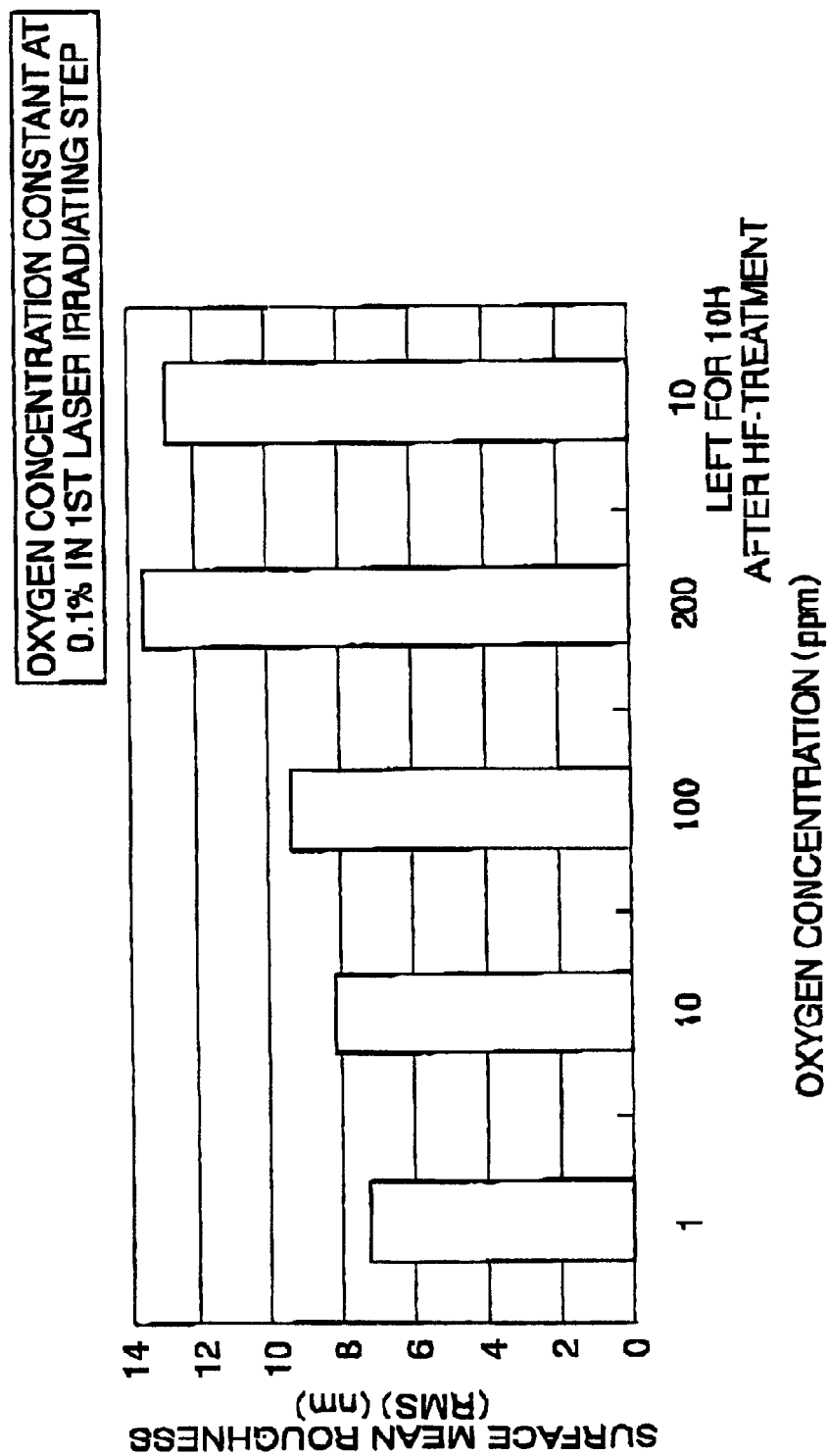
FIG. 3 explains effects of the first embodiment.
Figure 4:
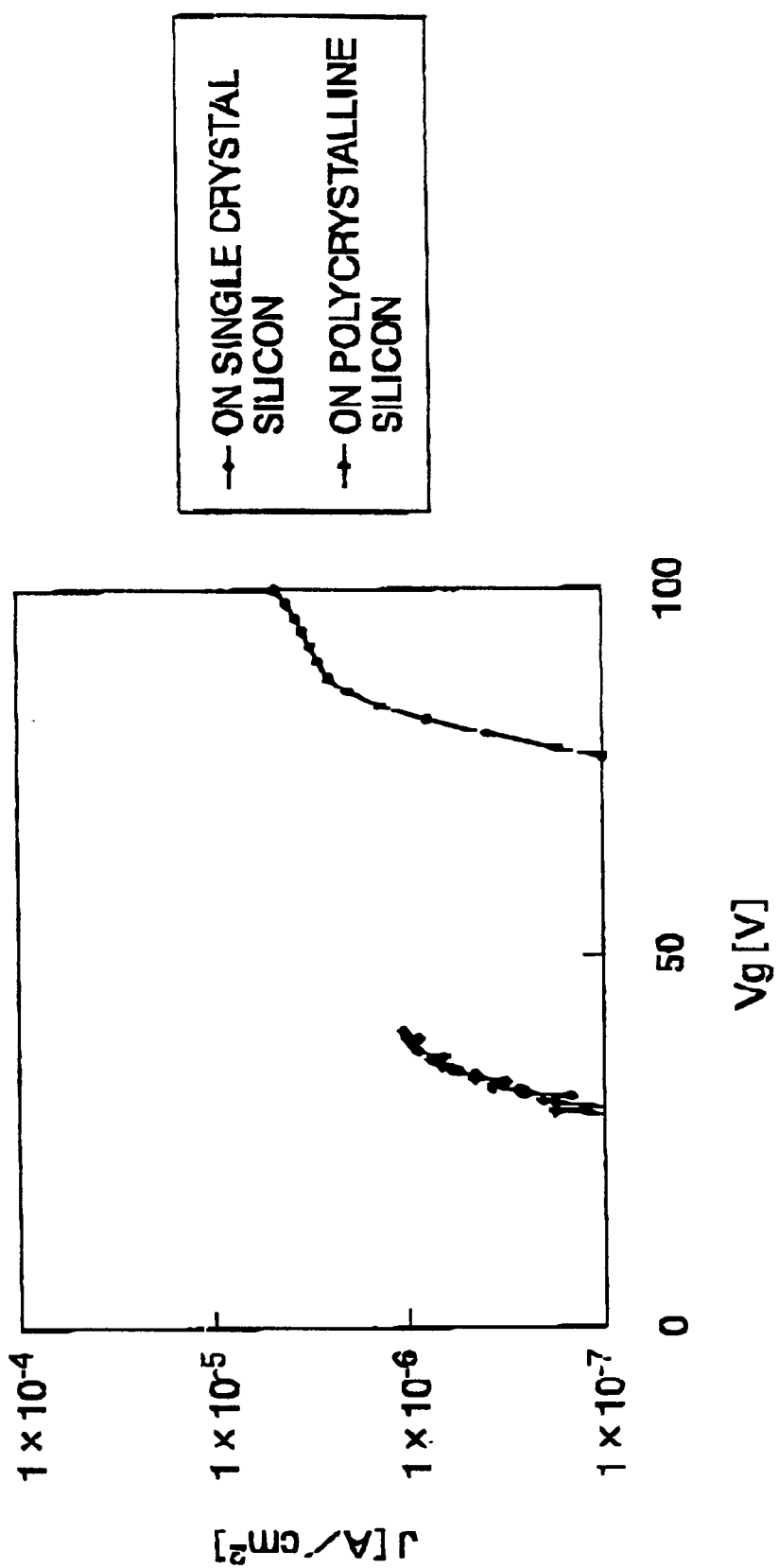
FIG. 4 shows a graph indicating the relationship between a gate voltage and a leak current for a known thin-film transistor.
Figure 5:
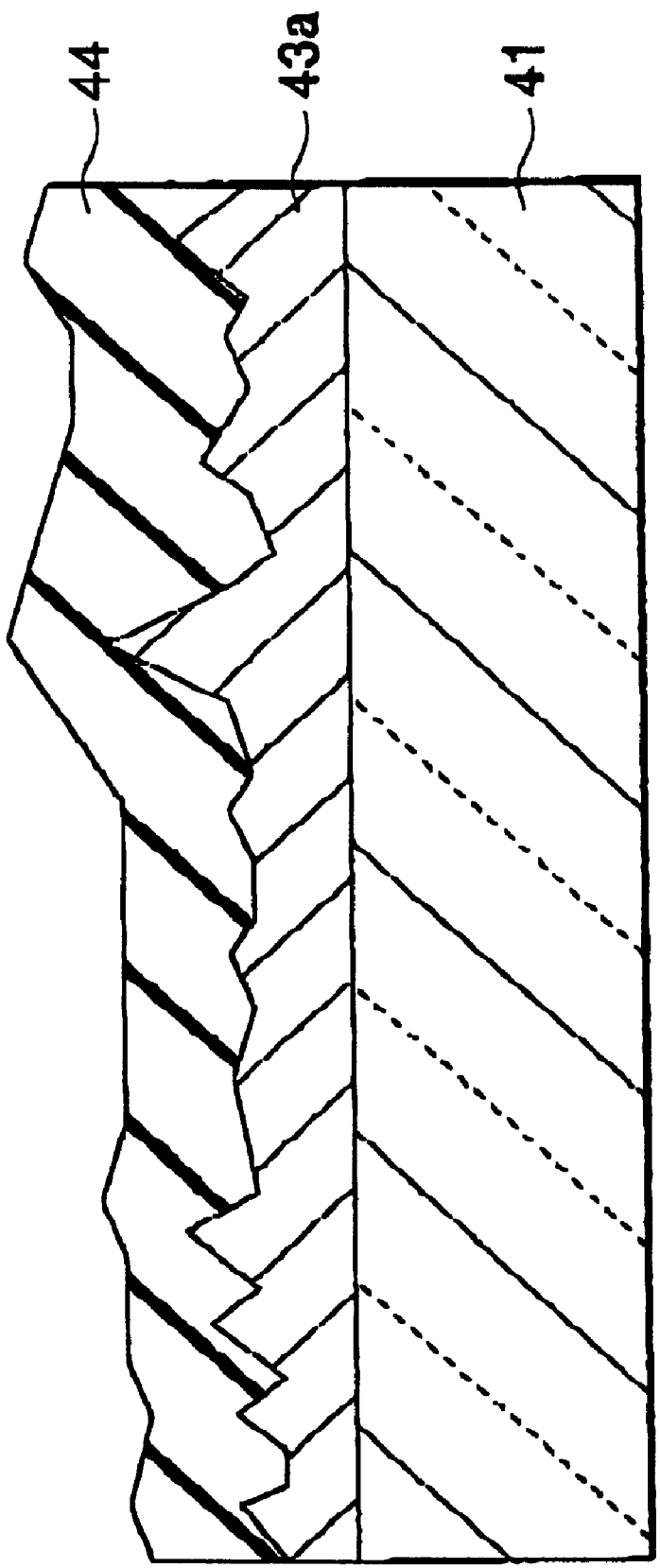
FIG. 5 is a cross-sectional view of the known thin-film transistor.
Figure 6:
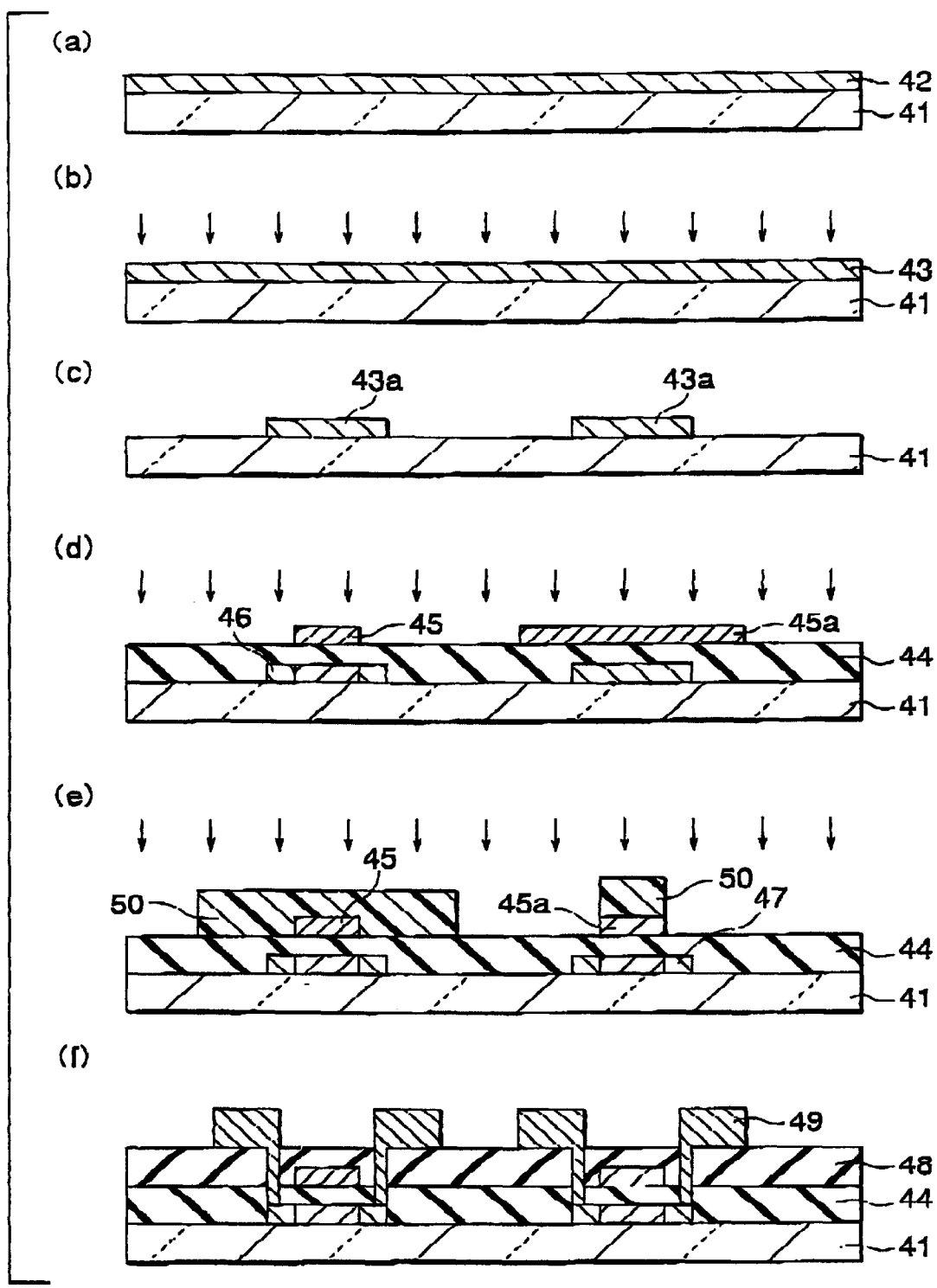
FIG. 6 shows cross-sectional views indicating steps of producing a thin-film transistor.

Disclosed with reference to FIGS. 1 to 3 is a first embodiment of a method of forming a polycrystalline semiconductor film according to the present invention. The forming method in this embodiment is shown in FIG. 1.

Firstly, an amorphous silicon film is formed on a substrate, as shown in step F1 in FIG. 1. In this embodiment, a 50 nm-thick amorphous silicon film is formed by CVD (chemical Vapor Deposition) with $SiH_4$ as a source gas.

Next, as shown in step F3 in FIG. 1, annealing is performed to decrease the amount of hydrogen in the amorphous silicon film for restricting abrasion that will occur during energy-rich beam irradiation. In this embodiment, annealing is performed at 450° C. for 30 min.

An etching process is performed to remove an natural oxide film formed on the surface of the amorphous silicon film, as shown in step F5 in FIG. 1. In this embodiment, 1-wt % HF solution is flown over the substrate surface for 2 min., followed by ultra pure water washing.

Immediately after this, the substrate is transferred into a processing chamber of a processing system filled with an atmosphere containing nitrogen as a major component. The processing system has a mechanism in which the substrate is sprayed with a gas containing nitrogen as a main component and also slight oxygen, at a pressure higher than the ambient pressure so that an area of the substrate to be irradiated with a laser beam is enclosed by the gas. A flow rate for nitrogen and oxygen is thus controlled by massflow, so that a ratio of nitrogen to oxygen is accurately controlled in the atmosphere to be irradiated with laser. The total flow rate for nitrogen and oxygen is set at 30 liter/min.$_4$ in this embodiment.

Next, as shown in step F7 in FIG. 1, the substrate is scanned with an excimer-laser pulse beam of 308 nm in wavelength at 390 mj/cm² in energy density in this atmosphere so that the substrate surface is irradiated with the laser twice. This laser-scanning recrystallizes the amorphous silicon film by melting to form a polycrystalline silicon film (the first laser irradiating step). The amount of oxygen in the first laser irradiating step in the this embodiment is a specific amount which is preferably from 1 ppm to 10%, as disclosed later. The first laser irradiating step is performed to decrease hydrogen in the silicon film for restricting abrasion and also form a thin oxide film on the surface of the polycrystalline silicon film.

Then, as shown in step F9 in FIG. 1, an oxygen concentration in the gas with which the substrate is sprayed is varied to be less than that for the first irradiating step. The substrate is then scanned with an excimer-laser pulse beam of 308 nm in wavelength at 440 mJ/cm² in energy density so that the substrate surface is irradiated 16 times to grow the grain to a desired diameter (the second laser irradiating step). The amount of oxygen at this time is a specific amount which is preferably from 1 ppm to 200 ppm, as disclosed later.

The total amount of energy for the second irradiating step is thus larger than that for the first irradiating step. The total amount of energy is obtained as energy density multiplied by the number of times of irradiation. In this embodiment, energy density for one-time irradiation is 390 mJ/cm² and 440 mJ/cm² for the first and the second laser irradiating steps, respectively. The energy density for one-time irradiation for the second irradiating step may, however, be smaller than that for the first irradiating step when the total amount of energy for the second irradiating step can be set as larger than that for the first irradiating step.

The polycrystalline silicon film is thus formed on the substrate through the steps F1 to F9 disclosed above.

It is preferable that the polycrystalline silicon film is exposed to an atmosphere between the first laser irradiating step and the second laser irradiating step, to have a desired thickness for the natural oxide film formed on the polycrystalline silicon film in the first irradiating step. Such atmosphere may have an oxygen concentration higher than those for atmospheres in the first and the second laser irradiating steps.

In an experiment, substrates were left for 10 hours with no processing after the natural oxide film formed on the amorphous silicon film had been etched away with HF, and then crystallized to produce samples. A spectral ellipsometer measured an about 1.5 nm-thick natural oxide film formed on the amorphous silicon film that had been left for 10 hours after etching.

The atmosphere contains nitrogen gas as a major component in the embodiment disclosed above, not only that, however, it may contain a rare gas instead of nitrogen gas. In other words, an inert gas with low response such as nitrogen gas and a rare gas can be used for such atmosphere.

Illustrated in FIG. 2 are an evaluation of a sample by atomic force microscopy on roughness and the number of occurrence of abrasion on a polycrystalline silicon film crystallized by the steps described above at 10 ppm in oxygen concentration in the second laser irradiating step and 1 ppm, 5 ppm, 0.1%, 1.0% and 10% in oxygen concentration in the first laser irradiating step.

Illustrated in FIG. 3 is an evaluation of a sample by atomic force microscopy on roughness on a polycrystalline silicon film crystallized by the steps described above at 0.1% in oxygen concentration in the first laser irradiating step and 1 ppm, 10 ppm, 100 ppm, and 200 ppm in oxygen concentration in the second laser irradiating step.

Also illustrated in FIG. 3 is another evaluation of a sample by atomic force microscopy on roughness on a polycrystalline silicon film crystallized by the steps described above in which a natural oxide film formed on an amorphous semiconductor film was removed by HF treatment and left for 10 hours with no processing to form an about 1.5 nm-thick natural oxide film on the amorphous semiconductor film, followed by the first laser irradiating step at 0.1% oxygen concentration and the second laser irradiating step at 10 ppm in oxygen concentration. The evaluation in this case teaches that this sample is not good in quality compared to the former sample because this sample has as about 13 nm-thick roughness on the polycrystalline silicon film whereas the former about 8 nm-size roughness that had been left for 10 hours after HF-treatment.

The term "roughness" means surface mean roughness expressed by RMS (Root-Mean-Square).

FIG. 2 teaches that abrasion occurred at 1 ppm in oxygen concentration in the first laser irradiating step, however, it was completely prevented at 5 ppm or more. Also taught in FIG. 2 is that the surface mean roughness was about 14 nm at 10% or more in oxygen concentration in the first laser irradiating step, thus no decrease in surface mean roughness, whereas the roughness was 10 nm or less when the oxygen concentration was less than 10%.

FIG. 3 teaches that the surface mean roughness was about 13 nm at 200 ppm or more in oxygen concentration in the second laser irradiating step, thus no decrease in surface mean roughness, whereas the roughness was sufficiently decreased when the oxygen concentration was less than 200 ppm.

These figures further teach that a surface oxide film of 1.5 nm or more in thickness formed before the first laser irradiation in step F7 causes less decrease in surface mean roughness even if the oxygen concentrations in both the first and the second laser irradiating steps lie in an allowable range.

It is not clear why laser irradiation to an atmosphere containing oxygen of 5 ppm or more in the first laser irradiating step can restrict abrasion. It is, however, speculated that crystallization in an oxygen atmosphere at a specific concentration or more might promote dehydrogenation with help of formed minute roughness and a surface oxide film formed in the first laser irradiating step might serve to restrict abrasion.

As discussed in the known method, it has been reported that surface roughness becomes small by completely removing a surface oxide film by HF-treatment after laser annealing in the ambient atmosphere, followed by vacuum laser annealing to a polycrystalline silicon.

On the contrary, this embodiment allows the first and the second laser irradiating steps to be performed in the same processing chamber, which can provides polycrystalline silicon with small surface roughness, thus lowering of the performance of thin-film transistor being prevented, with no decrease in productivity which may otherwise occur due to requirements for the known method such as switching the atmosphere into vacuum and treatment between processing steps.

Moreover, this embodiment uses the excimer laser as the energy-rich beam in the first and the second laser irradiating steps, however, not only that, any other types of energy-rich beam can be used at as long as they can change an amorphous semiconductor film into a polycrystalline semiconductor film.

Second Embodiment

Figure 7:
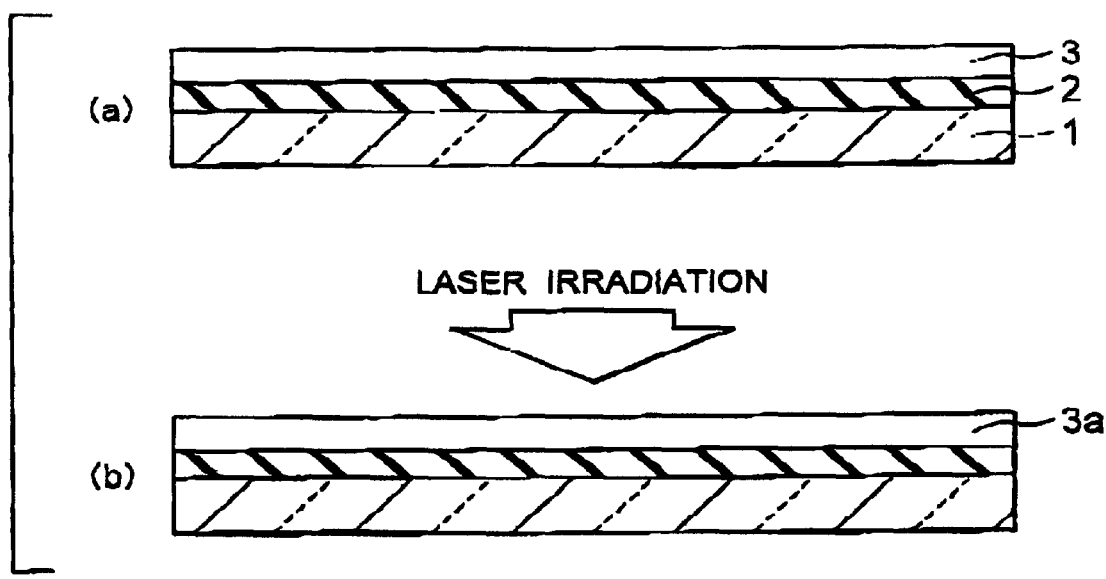
FIG. 7 shows cross-sectional views indicating steps of a second embodiment of a method of forming a polycrystalline semiconductor film according to the present invention.

Disclosed with reference to FIG. 7 is a second embodiment of a method of forming a polycrystalline semiconductor film according to the present invention. FIG. 7 is a cross-sectional view showing forming steps in the forming method in this embodiment.

Firstly, an under-coating layer 2 made of SiN and $SiO_2$ films is formed by plasma CVD on an insulative substrate 1 containing nonalkali glass of 400 mm×500 mm is size, and a 50 nm-thick polycrystalline silicon film 3 is formed on the layer 2, as shown in FIG. 7(a).

The polycrystalline silicon film 3 may be formed by one of the following three methods.

(1) An amorphous silicon film is formed, followed by 1-hour annealing at 500° C., to decrease hydrogen concentration in the amorphous silicon film. Subsequently, like the first embodiment, the amorphous silicon film is changed into the polycrystalline silicon film 3 in an atmosphere of an inert gas containing oxygen at 5 ppm or more but less than 10%.

(2) The polycrystalline silicon film 3 is directly formed on the substrate 1. Or, (3) An amorphous silicon film is formed on the substrate 1, followed by annealing in an oven at a temperature at which silicon will be melted or lower, thus changed into the polycrystalline silicon film 3.

The following experiments were conducted to determine optimum laser-annealing requirements to the polycrystalline silicon film formed as described above.

Polycrystalline silicon films 3 were formed on several substrates 1 according to the methods disclosed above.

These substrates 1 were set in annealing chambers with $N_2$-atmosphere containing oxygen at 0.1 ppm, 1 ppm, 10 ppm, 50 ppm, 100 ppm and 1000 ppm, respectively. The polycrystalline silicon films were annealed by laser beam annealing using the excimer laser at 308 nm (XeCl) in wavelength while scanning each substrate 1 so that it was irradiated with 20 pulses per section on the substrate, to recrystallize each polycrystalline silicon film 3, thus forming a polycrystalline silicon film 3a, as shown in FIG. 7(b). The laser beam used for crystallization may be KrF or ArF, etc. Irradiating energy density were varied from 300 $mJ/cm^2$ to 450 $mJ/cm^2$.

Figure 8:
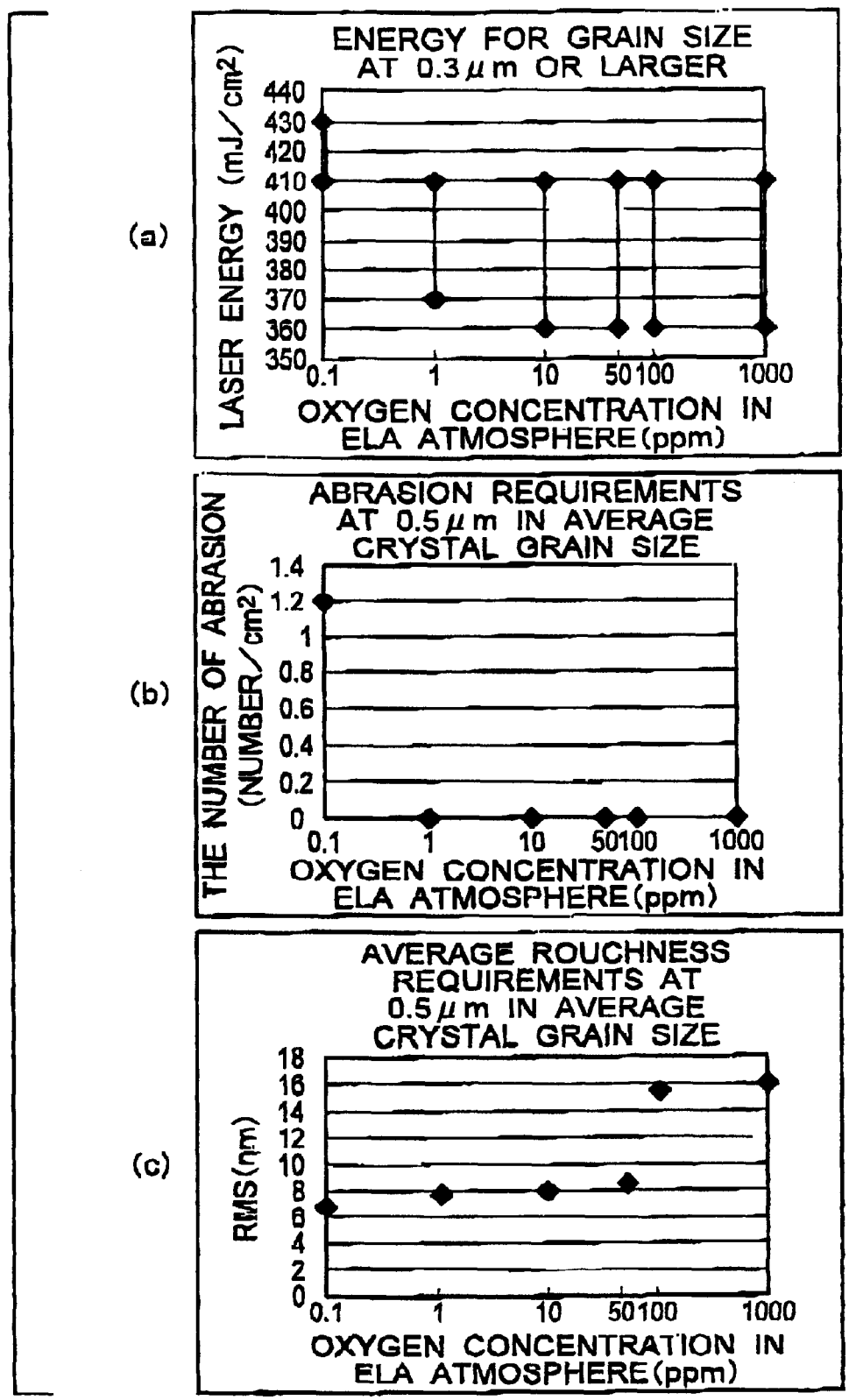
FIG. 8 shows graphs indicating results of experiments for determining optimum laser irradiation requirements for recrystallization of polycrystalline silicon.

Results of the experiments are shown in FIGS. 8(a), 8(b) and 8(c).

FIG. 8(a) is a graph indicating laser irradiating energy required for obtaining average grain size at 0.3 μm or larger under each excimer-laser annealing atmosphere requirements. It is taught in FIG. 8(a) that the sample produced at oxygen concentration of 0.1 ppm requires a certain degree of laser energy for obtaining average grain size at 0.3 μm or larger, the degree being higher and having a margin narrower than the other oxygen concentration requirements. On the other hand, the oxygen concentrations from 1 ppm to 1000 ppm require almost the same laser energy.

FIG. 8(b) is a graph indicating the number of occurrence of abrasion in each atmosphere. It is indicated in FIG. 8(b) that abrasion did not occur at the oxygen concentration of 1 ppm or more whereas it occurred for 1.2 times per 1 $cm^2$ at the oxygen concentration of 0.1 ppm.

FIG. 8(c) is a graph indicating the size of roughness formed on the surface of the polycrystalline silicon in each atmosphere. It is indicated in FIG. 8(c) that the size of roughness was 10 nm or lower at the oxygen concentration of 50 ppm or less whereas it suddenly become higher at the oxygen concentration of 100 ppm.

These experiments teach that the optimum laser irradiating requirements for recrystallization of the polycrystalline silicon film 3 shown in FIG. 7(b) include the atmosphere containing nitrogen as a major component with oxygen of 1 ppm or more but 50 ppm or less in concentration.

The following are speculated reasons for the optimum laser irradiating requirements.

Convex portions on a polycrystalline silicon surface have higher oxygen ratio than the other portions, which is speculated that convex portions are formed by cubical expansion of oxides that are formed by segregation of oxygen contained in a silicon film during recrystallization. The adjustment to oxygen concentration at 50 ppm or less serves to restrict the amount of oxygen to be absorbed into the silicon film, thus restricting the surface roughness formed during recrystallization by melting. Such adjustment, however, obstructs growth of grain or causes abrasion of the silicon film when the oxygen concentration in an atmosphere becomes less than 1 ppm. It is speculated that oxygen absorbed into the silicon film during recrystallization by melting become crystal nucleus to promote crystallization. It is thus further speculated that, since formation of nucleus is restricted as oxygen concentration in an atmosphere becomes too low, problems occur such as larger energy for crystallization, narrow margin of particle-diameter enlargement to energy, and degradation of particle-diameter distribution. On the contrary, oxygen absorbed into the silicon film forms bonding of Si—O—H etc., to restrict dehydrogenation from the film, thus preventing abrasion. As discussed above, the atmosphere to be irradiated with laser requires oxygen concentration at a specific degree or more.

Accordingly, in this embodiment, laser irradiation is performed in an atmosphere containing nitrogen as a major component with oxygen of 1 ppm or more but 50 ppm or less in concentration, to recrystallize the polycrystalline silicon film 3, thus forming the polycrystalline silicon film 3a. This process serves to restrict roughness on the surface of the film 3a formed by recrystallization, so that performance of thin-film transistors is prevented from lowering.

Third Embodiment

Figure 9:
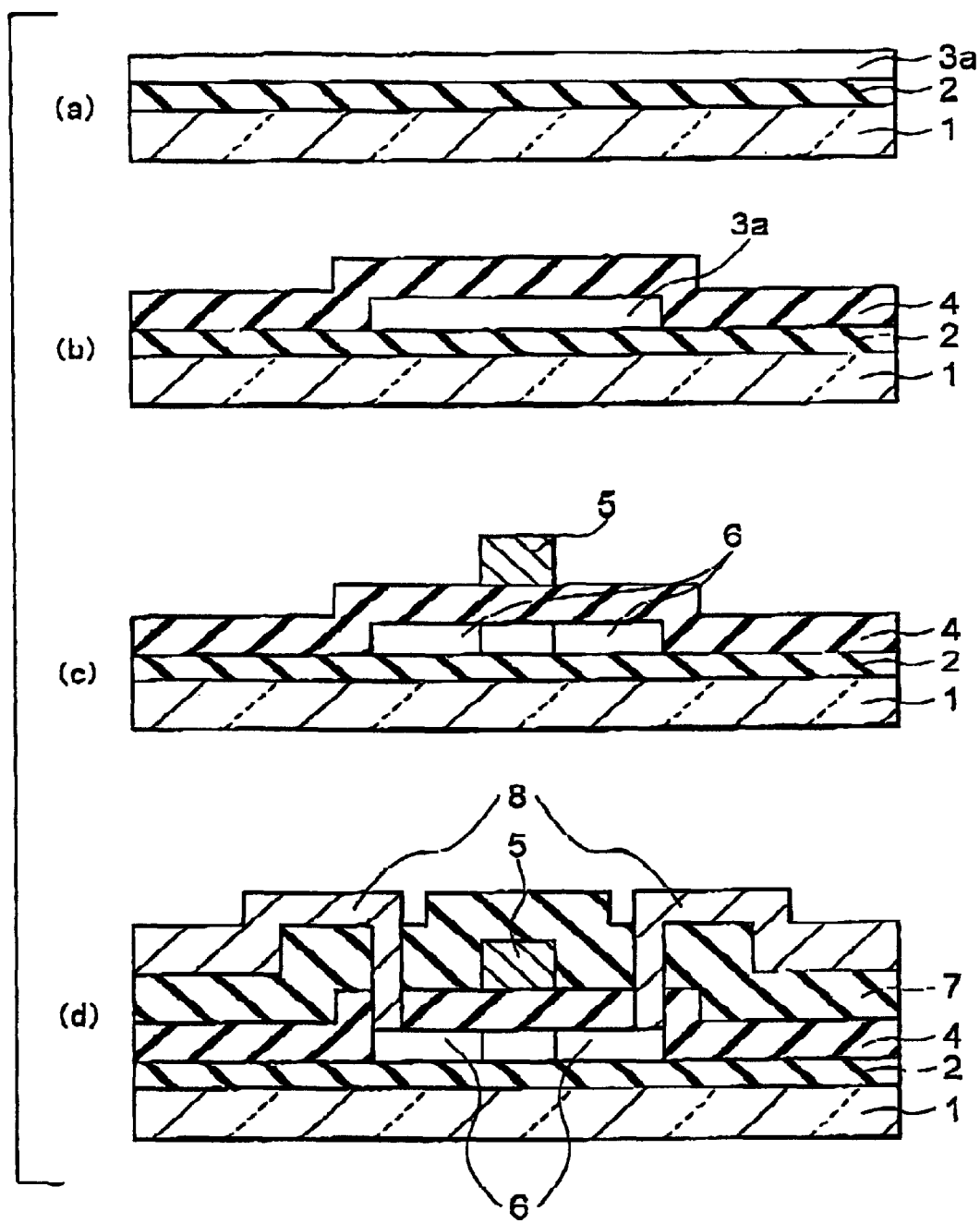
FIG. 9 shows cross-sectional views indicating steps of producing a thin-film transistor under a third embodiment of a method of forming a polycrystalline semiconductor film according to the present invention.

Disclosed with reference to FIG. 9 is a third embodiment of a method of forming a polycrystalline semiconductor film according to the present invention. FIG. 9 shows cross-sectional views indicating steps of producing a thin-film transistor according to the forming method in this embodiment.

According to the method like the second embodiment, a polycrystalline silicon film 3a is formed on an insulative substrate 1 via an under-coating layer 2 formed thereon, as shown in FIG. 9(a). The film 3a is patterned like an island and then a gate insulating film 4 made of an $SiO_2$ film is formed by plasma CVD, as shown in FIG. 9(b).

Formed subsequently is a gate electrode 5 made of a high-melting point metal such as Mo and Ta or doped polycrystalline silicon. After the gate electrode 5 is patterned, dopant is implanted by ion doping to form source/drain regions 6, as shown in FIG. 9(c).

Formed lastly are an interlayer insulating film 7 made of $SiO_2$ and source/drain-contact holes. Further, Al-source/drain electrodes 8 are formed by sputtering. The electrodes 8 are patterned to obtain a polycrystalline silicon TFT, as shown in FIG. 9(d).

Figure 10:
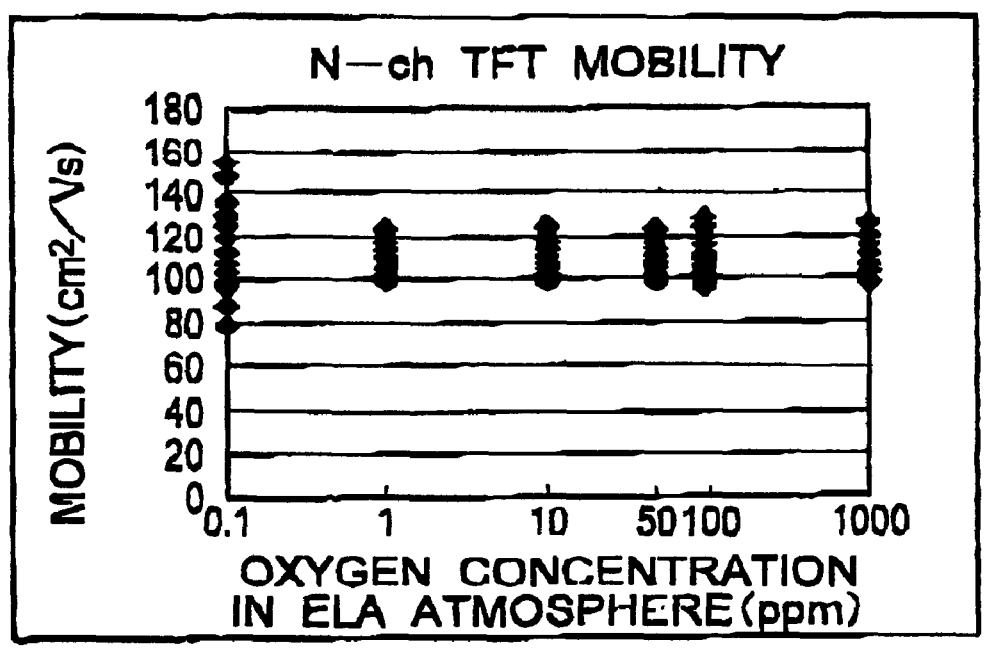
FIG. 10 shows a graph indicating change in mobility of thin-film transistors in accordance with change in laser irradiation requirements under which the transistors were produced.

FIG. 10 is a graph indicating the relationship between field-effect mobility and the requirements of oxygen concentration in atmosphere for polycrystalline silicon thin-film transistors (TFT) produced under several laser irradiating requirements, like described in the second embodiment. The laser irradiating energy is set at a degree so that grain size becomes 0.5 μm in FIG. 10.

FIG. 10 teaches that the average field-effect mobility is not dependant on atmosphere to be irradiated, however, there is a big variation in the characteristics at 0.1 ppm in oxygen concentration.

As disclosed above, like the second embodiment, this embodiment prevents lowering of the performance of thin-film transistors with no decrease in productivity.

Also in the second and the third embodiments, crystallization can be performed while a section of the substrate to be irradiated with an energy-rich beam is sprayed with a gas at a pressure higher than the atmosphere in the processing chamber.

As disclosed, the performance of thin-film transistors can be prevented from lowering, with no decrease in productivity, according to the present invention.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended claims and their equivalents.

What is claimed is:

1. A method of forming a polycrystalline semiconductor film comprising:
    depositing an amorphous semiconductor film on a substrate;
    first irradiating the amorphous semiconductor film with an energy-rich beam in an atmosphere of a gas containing an inert gas as a major component with a specific amount of oxygen, to change the amorphous semiconductor film into a polycrystalline semiconductor film; and
    second irradiating the polycrystalline semiconductor film with an energy-rich beam in an atmosphere of a gas containing an inert gas as a major component with oxygen of an amount less than the specific amount.

2. The method of forming a polycrystalline semiconductor film according to claim 1, wherein an amount of oxygen for the first irradiating is 5 ppm or more but less than 10% and an amount of oxygen for the second irradiating is less than 200 ppm.

3. The method of forming a polycrystalline semiconductor film according to claim 1, wherein the total amount of energy for the second irradiating is larger than the total amount of energy for the first irradiating.

4. The method of forming a polycrystalline semiconductor film according to claim 1, wherein the polycrystalline semiconductor film is exposed to an atmosphere between the first irradiating and the second irradiating, the atmosphere having an oxygen concentration higher than oxygen concentrations in the atmospheres in the first and the second irradiating.

5. The method of forming a polycrystalline semiconductor film according to claim 1, wherein the first and the second irradiating are performed in the same processing chamber.

6. The method of forming a polycrystalline semiconductor film according to claim 1 further comprising removing a natural oxide film formed on the surface of the amorphous semiconductor film just before the first irradiating.

7. The method of forming a polycrystalline semiconductor film according to claim 1, wherein an excimer laser beam is used as the energy-rich beam.

8. The method of forming a polycrystalline semiconductor film according to claim 1, wherein the number of irradiation of the energy-rich beam in the first irradiating is smaller than the number of irradiation of the energy-rich beam in the second irradiating.

9. The method of forming a polycrystalline semiconductor film according to claim 1, wherein crystallization is performed while a section of the substrate to be irradiated with the energy-rich beam is sprayed with a gas at a pressure higher than the atmosphere in the processing chamber.

10. A method of forming a polycrystalline semiconductor film comprising:
    forming a polycrystalline semiconductor film on a substrate;
    irradiating the polycrystalline semiconductor film with an energy-rich beam in an atmosphere of a gas containing an inert gas as a major component with oxygen, an amount of the oxygen being 1 ppm or more but 50 ppm or less.

11. The method of forming a polycrystalline semiconductor film according to claim 10, wherein crystallization is performed while a section of the substrate to be irradiated with the energy-rich beam is sprayed with a gas at a pressure higher than the atmosphere in the processing chamber.

12. A method of forming a polycrystalline semiconductor film comprising:
    depositing an amorphous semiconductor film on a substrate;
    first irradiating the amorphous semiconductor film with an energy-rich beam in an atmosphere of a gas containing an inert gas as a major component with oxygen, an amount of the oxygen being 5 ppm or more but less than 10%, to change the amorphous semiconductor film into a polycrystalline semiconductor film; and
    second irradiating the polycrystalline semiconductor film with an energy-rich beam in an atmosphere containing an inert gas as a major component with oxygen, an amount of the oxygen being 1 ppm or more but 50 ppm or less.

13. The method of forming a polycrystalline semiconductor film according to claim 12 further comprising removing a natural oxide film formed on the amorphous semiconductor film just before the first irradiating.

14. The method of forming a polycrystalline semiconductor film according to claim 12, wherein crystallization is performed while a section of the substrate to be irradiated with the energy-rich beam is sprayed with a gas at a pressure higher than the atmosphere in the processing chamber.

* * * * *